Figure 1:
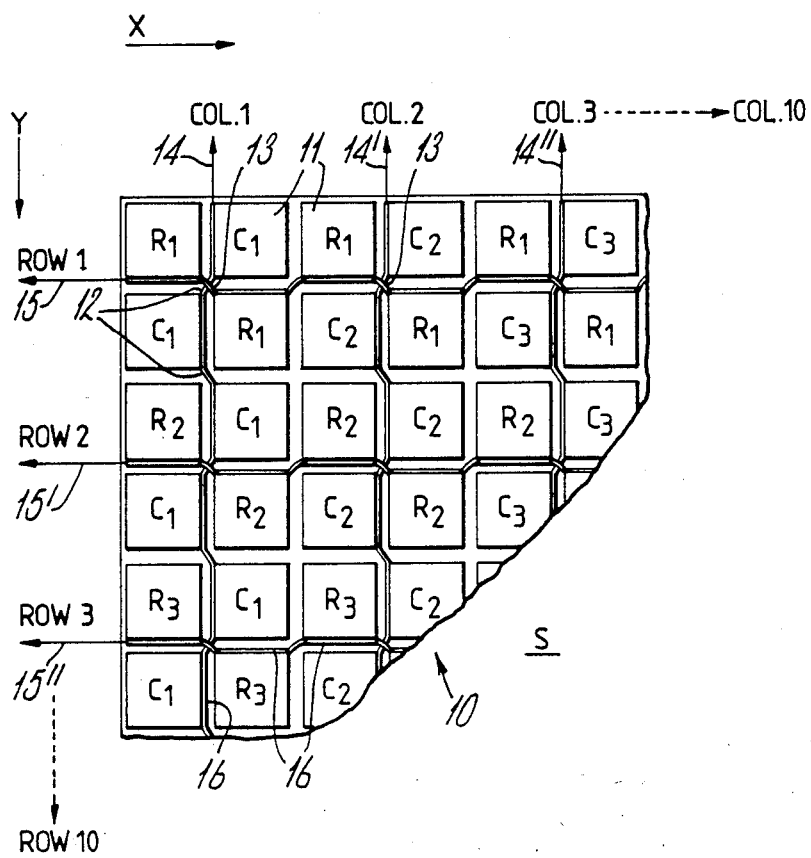

United States Patent [19]

Sedgbeer

[11] Patent Number: 4,889,984
[45] Date of Patent: Dec. 26, 1989

[54] RADIATION DETECTOR ARRAYS HAVING REDUCED NUMBER OF SIGNAL PATHS

[75] Inventor: Melvyn D. Sedgbeer, Bracknell, United Kingdom

[73] Assignee: British Aerospace Pubic Limited Company, London, England

[21] Appl. No.: 111,120

[22] Filed: Oct. 21, 1987

Related U.S. Application Data

[63] Continuation-in-part of Ser. No. 926,881, Nov. 6, 1986, abandoned, which is a continuation of Ser. No. 721,668, Apr. 10, 1985, abandoned.

[30] Foreign Application Priority Data

Apr. 14, 1984 [GB] United Kingdom ................. 8409760

[51] Int. Cl.⁴ ........................................... H01J 40/14
[52] U.S. Cl. .............................. 250/211 R; 250/578
[58] Field of Search .............. 250/211 R, 211 J, 578, 250/204, 201 R, 203 R; 356/141, 152, 400, 401; 358/212, 213.11; 357/30 Q, 31, 32

[56] References Cited

U.S. PATENT DOCUMENTS

| | | | |
|---|---|---|---|
| 3,268,185 | 8/1966 | Eckermann | 250/203 R |
| 3,437,815 | 4/1969 | Bleicher | 250/203 R |
| 3,450,479 | 6/1969 | Dauber | 250/203 R |
| 3,634,689 | 1/1972 | Ejiri | 250/203 R |
| 3,900,716 | 8/1975 | Kawabata et al. | 250/211 J |
| 3,971,003 | 7/1976 | Kosonocky | 357/24 |
| 4,081,841 | 3/1978 | Ochi et al. | 250/211 J |
| 4,541,015 | 9/1985 | Itoh et al. | 250/578 |
| 4,695,158 | 9/1987 | Kotaka et al. | 250/201 |

FOREIGN PATENT DOCUMENTS 2122833 1/1984 United Kingdom .
2125217 2/1984 United Kingdom .

*Primary Examiner*—David C. Nelms
*Attorney, Agent, or Firm*—Cushman, Darby & Cushman

[57] ABSTRACT

A radiation detector for use in a system for determining the centroid of an image incident thereon comprises an array of photodetector elements formed on a substrate and electrically connected, preferably by selective metallization to form desired groups of elements, each group having a single output means, whereby the centroid of an image on the detector may be deduced.

7 Claims, 2 Drawing Sheets

RADIATION DETECTOR ARRAYS HAVING REDUCED NUMBER OF SIGNAL PATHS

This is a continuation-in-part of application Ser. No. 926,881, filed Nov. 6, 1986, which was abandoned upon the filing hereof and which was a continuation of Ser. No. 721,668, filed Apr. 10, 1985, now abandoned.

This invention relates to radiation detectors comprising an array of radiation detector elements arranged to enable the position of an incident image to be deduced.

In the conventional staring array type of detectors a X×X square matrix array of photodiode detector elements is provided, each element having a respective output connection which is usually in the form of a flying lead directly connected to the face of the element and extending to a terminal provided at the edge of the detector. Naturally, where the order of the matrix is high, many independent signal paths need to be provided on the face of the array each extending to the edge of the detector for connection to a respective preamplifier. This results in masking of the elements, and such connections are expensive and may affect reliability in view of the need to attach fine flying leads to each element. Moreover, it will be appreciated that in this type of arrangement, $X^2$ preamplifiers are required which leads to high costs.

According to one aspect of this invention, there is provided a radiation detector for indicating the position of an image incident thereon, including an array of radiation sensitive detector elements formed on a substrate selectively electrically interconnected to form desired groups of interconnected detector elements, each group having respective signal output means, the groups being selected such that the position of an image incident upon said detector may be deduced from the signals present at said signal output means.

According to another aspect of this invention, there is provided a radiation detector for indicating the position of an image incident thereon, including an array of radiation sensitive detector elements, interconnection means electrically interconnecting selected elements of the array to form a plurality of electrically discrete groups each having respective signal output means, said groups being arranged in two series each series being disposed such that on incidence of an image on said detector, each series of groups generates an output indicative of a respective coordinate of the image with respect to the detector, whereby the position of the image may be determined.

By this arrangement, since each element of a group provides a signal at an output common to the group, the number of preamplifiers may be reduced. In addition, since each element does not require an individual signal path to the edge of the detector, but rather requires only a signal path to an adjacent element of the same group, the length of the signal tracks on the face of the array may be reduced and need not obscure any elements of the array.

Preferably, at least a major portion of the elements constituting the array is interconnected by metallisation of the substrate.

In one embodiment, the array is of rectangular matrix form, and the elements are interconnected to form two series of groups, one series of groups extending in zig-zag fashion in a given direction generally parallel to one side of the array and the other series extending in zig-zag fashion in a direction generally perpendicular to said given direction. In this embodiment, the interconnecting means extend generally diagonally across each unit square or rectangle of the array, and in any given row or column of the array, alternate elements are of the same group, the intermediate elements being members of individual groups extending perpendicular to said first-mentioned group. By this arrangement, a N×N square matrix array of detector elements need have only N output means, with a corresponding reduction in the number of preamplifiers required.

In another embodiment, the array of radiation sensitive detector elements is arranged in a polar coordinate format with one series of groups extending radially and the other series of groups extending circumferentially, i.e., the two series extend generally transversely relative to one another rather than mutually perpendicular as in the first embodiment.

Where appropriate, the elements of a respective one series of groups may be interconnected by selective metallisation, and the elements of the respective other series of groups may also be interconnected by metallisation except where this is not feasible due to existing metallisation, in which case the elements may be interconnected by wire bonds.

Figure 2:
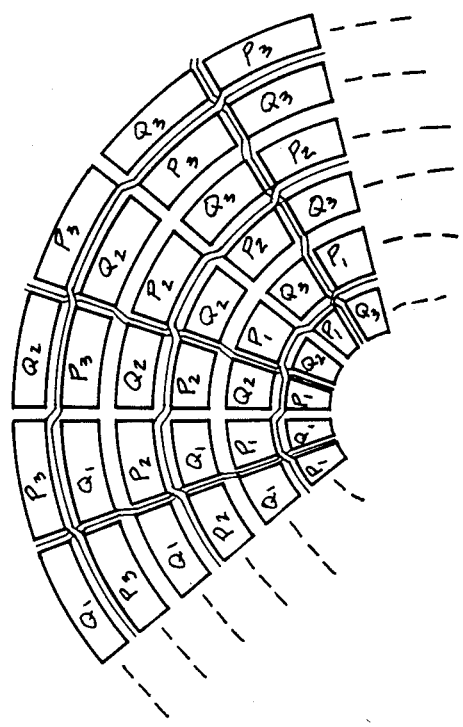

Further aspects will become apparent from the following description which is by way of example only, in which reference will be made to the accompanying drawing, wherein:

FIG. 1 shows a corner region of a radiation detector wherein respective series of detector elements extend mutually perpendicularly, and FIG. 2 shows a segment of a second embodiment wherein respective series of detector elements extend circumferentially and radially relative to each other.

The radiation detector is for use in a system which is capable of tracking the centroid of an image incident on the array. Radiation from the field of view of the detector is caused to fall on the array and the output from the array is processed to deduce the position of the centroid of the image. Whilst the term "image" is used in the specification, it is to be understood that this does not necessarily mean that the radiation is brought to a sharp focus on the array; indeed in some circumstances it may be beneficial deliberately to defocus the image.

In FIG. 1 there is shown the corner region of a 20×20 square matrix array 10 of photodiode elements formed by processes known in the art on a substrate S of silicon. The fabrication of the elements may be optimised for various wavelengths, and in the present case, the elements are optimised for good I.R. sensitivity (approx 1064 nM wavelength).

In the array, selected groups of elements 11 are interconnected by selective metallisation 12 of the substrate material or by wire bonds 13 which pass over and thus are insulated from the metallisation on the surface.

The term "metallisation" is used in this specification in the context understood by those skilled in the art relating to the fabrication of integrated circuits to mean the deposition of an electrically conductive metal or oxide on the substrate.

In the arrangement shown in FIG. 1, wire bond 13 are used to connect two elements only where the presence of metallisation connecting two further elements prevents the use of metallisation. One series of groups extends in the Y direction in zig-zag fashion to form electrically discrete columns each of which having a respective output 14,14' etc. The other series of groups extends in the X direction in zig-zag fashion to form discrete rows each of which having a respective output 15,15' etc. For ease of identification on the drawing, each element is identified with $R_1$, $C_1$, etc. to identify the particular group to which the element belongs. In order to assist interconnection of the elements, a side region of each element is metallised as shown at 16. It will be apparent from FIG. 1 that an image incident on an interstice of the array and the adjacent corners of the respective array elements will generate a unique combination of signals at the outputs 14,14', 15,15' etc, from which coordinates of the image on the array may be deduced.

The signal from each row is supplied to a respective dedicated preamplifier (not shown), the output from the preamplifiers being processed, using techniques known to those skilled in the art, to determine the centroid of an image incident upon the array.

Whilst the above embodiment has a square matrix array of groups of zig-zag form arranged orthogonally, other configurations of array and dispositions of groups are possible without departing from the invention.

For example, as shown in FIG. 2, the radiation sensitive detector elements are arranged in a polar coordinate format with one series of groups $P_n$ extending radially and the other series of groups $Q_n$ extending circumferentially. The detector elements in FIG. 2 are interconnected in a manner analogous to the arrangement in FIG. 1 as above described. Of course, the detector elements in a FIG. 2 type embodiment would subscribe a complete circle, and there may be any desired number elements in a radially extending group, for example ten. In the circular/radial arrangement of FIG. 2, it will be appreciated that the radial and circumferential series extend generally transversely relative to one another rather than mutually perpendicularly as in FIG. 1.

In the embodiments described above, all of the elements are connected to output pins for connection to a virtual earth amplifier. The array in each case is totally linear in operation and may be considered as analogue in nature involving no temporal sampling. Consequently, the radiation detectors described can locate a short duration signal with a simple threshold detector, i.e., since the output signal is linear, the detection depends solely on the signal level being discernible above the current background noise level. This property enables greater sensitivity of detection to be achieved.

In each embodiment, the two series of groups of detectors, i.e., rows and columns in FIG. 1 and radially extending and circumferentially extending groups in FIG. 2, provide information concurrently in real time at the output pins for subsequent processing. Thus in FIG. 1, the detector may comprise a 10×10 array of diode quadrant detectors, i.e., a 20×20 array of diode elements, interconnected as shown to provide ten rows/columns of continuous temporal information. In effect, there is a spatial sampling of the formed image, i.e., a snapshot of 50% of the image to form row information and 50% to form column information. The arrangements shown facilitate analogue processing and provide improved performance beyond that achievable with temporally sampled digital devices.

It will be appreciated that the above-described embodiments of radiation detector are capable of image centroid tracking and make use of fewer interconnections and fewer amplifiers than prior art devices.

I claim:

1. A radiation detector for indicating the position of an image incident thereon, comprising:
    a matrix of radiation sensitive detector elements formed on a substrate;
    interconnection means electrically interconnecting selected elements of the array to form a plurality of electrically discrete groups each having respective signal output means, said group being arranged in two series;
    each series of groups extending non-rectilinearly and generally transversely relative to one another; and
    said series being disposed such that on incidence of an image on said detector, each series of groups generates an output indicative of a respective coordinate of the image with respect to the detector, whereby the position of the image may be determined.

2. A radiation detector as claimed in claim 1, wherein a major portion of the elements constituting the matrix is interconnected by metallisation of the substrate.

3. A radiation detector as claimed in claim 1, wherein the matrix is of rectangular form and the elements in one of the series of groups extend generally parallel to one side of said array while the elements in the other series extend generally perpendicular to said side of the array.

4. A radiation detector array as claimed in claim 1, wherein each of said elements comprises a photodiode.

5. A radiation detector according to claim 1, wherein the elements in each group extend in zig-zag fashion.

6. A radiation detector as claimed in claim 1 wherein the matrix is of generally circular form and the elements in one of the series of groups extend generally radially while the elements in the other series of groups extend generally circumferentially.

7. A radiation detector as claimed in claim 6 wherein one or more of the elements are arcuate in shape.

* * * * *